(12) United States Patent
Sasaki et al.

(10) Patent No.: US 11,877,525 B2
(45) Date of Patent: Jan. 16, 2024

(54) STORAGE DEVICE HAVING A RESISTANCE CHANGE MEMORY ELEMENT AND WRITING METHOD THEREOF

(71) Applicant: KIOXIA CORPORATION, Tokyo (JP)

(72) Inventors: Takayuki Sasaki, Yokohama Kanagawa (JP); Yukihiro Nomura, Taito Tokyo (JP)

(73) Assignee: Kioxia Corporation, Tokyo (JP)

(*) Notice: Subject to any disclaimer, the term of this patent is extended or adjusted under 35 U.S.C. 154(b) by 159 days.

(21) Appl. No.: 17/410,771

(22) Filed: Aug. 24, 2021

(65) Prior Publication Data

US 2022/0310918 A1 Sep. 29, 2022

(30) Foreign Application Priority Data

Mar. 23, 2021 (JP) ................. 2021-048607

(51) Int. Cl.
*H10N 70/00* (2023.01)
*G11C 13/00* (2006.01)
(Continued)

(52) U.S. Cl.
CPC ..... *H10N 70/8828* (2023.02); *G11C 13/0004* (2013.01); *G11C 13/0069* (2013.01);
(Continued)

(58) Field of Classification Search
CPC .............. H10N 70/8828; H10N 70/231; H10N 70/826; H10N 70/882; G11C 13/0004;
(Continued)

(56) References Cited

U.S. PATENT DOCUMENTS 8,658,998 B2  2/2014  Minemura et al.
10,090,460 B2  10/2018  Saito et al.
(Continued)

FOREIGN PATENT DOCUMENTS

JP  2007-235128 A  9/2007
JP  2012-234903 A  11/2012
(Continued)

OTHER PUBLICATIONS

Padilla et al., "Voltage polarity effects in Ge2Sb2Te5-based phase change memory devices" Journal of Applied Physics 110, 054501, 2011, pp. 1-12.
(Continued)

*Primary Examiner* — Jerome Leboeuf
(74) *Attorney, Agent, or Firm* — Kim & Stewart LLP (57) ABSTRACT

A storage device includes a resistance change memory element including a first electrode, a second electrode, a resistance change layer between the first and second electrodes, including at least two elements selected from a group consisting of germanium (Ge), antimony (Sb), and tellurium (Te), and having a crystal structure with a c-axis oriented in a first direction from the first electrode toward the second electrode, and a first layer between the first electrode and the resistance change layer and including nitrogen (N) and at least one of silicon (Si) or germanium (Ge).

28 Claims, 11 Drawing Sheets

(51) Int. Cl.
*H10B 63/00* (2023.01)
*H10N 70/20* (2023.01)

(52) U.S. Cl.
CPC ........... *H10B 63/24* (2023.02); *H10N 70/231* (2023.02); *G11C 2013/0083* (2013.01); *G11C 2213/72* (2013.01)

(58) Field of Classification Search
CPC ........ G11C 13/0069; G11C 2013/0083; G11C 2213/72; G11C 2013/008; G11C 2013/0092; G11C 2213/76; H10B 63/24; H10B 63/30; H10B 63/80
See application file for complete search history.

(56) References Cited

U.S. PATENT DOCUMENTS

| | | | |
|---|---|---|---|
| 10,157,670 B2 | 12/2018 | Pirovano et al. | |
| 2007/0200108 A1 | 8/2007 | Noh et al. | |
| 2009/0180314 A1* | 7/2009 | Liu | G11C 13/0004 257/E47.001 |
| 2010/0284213 A1 | 11/2010 | Savransky | |
| 2011/0080781 A1 | 4/2011 | Goux | |
| 2013/0044534 A1* | 2/2013 | Kawai | G11C 13/0069 365/148 |
| 2014/0278160 A1* | 9/2014 | Wei | G11C 29/50 702/65 |
| 2016/0267975 A1 | 9/2016 | Takeuchi et al. | |
| 2017/0062711 A1 | 3/2017 | Saito et al. | |
| 2018/0114900 A1* | 4/2018 | Kamata | H10N 70/826 |
| 2019/0295636 A1 | 9/2019 | Tortorelli et al. | |
| 2021/0202839 A1* | 7/2021 | Tominaga | H10N 70/235 |

FOREIGN PATENT DOCUMENTS

| | | |
|---|---|---|
| JP | 5143280 B2 | 2/2013 |
| JP | 2016-167326 A | 9/2016 |
| JP | 2019-532453 A | 11/2019 |
| JP | 2020-502720 A | 1/2020 |
| WO | 2015/174240 A1 | 11/2015 |

OTHER PUBLICATIONS

Matsui et al., "Ta2O5 Interfacial Layer between GST and W Plug enabling Low Power Operation of Phase Change Memories," 2006 International Electron Devices Meeting, 2006, pp. 1-4.

Navarro et al., "Innovative PCM+OTS device with high sub-threshold non-linearity for non-switching reading operations and higher endurance performance," 2017 Symposium on VLSI Technology Digest of Technical Papers, 2017, pp. T94-T95.

* cited by examiner

STORAGE DEVICE HAVING A RESISTANCE CHANGE MEMORY ELEMENT AND WRITING METHOD THEREOF

CROSS-REFERENCE TO RELATED APPLICATION

This application is based upon and claims the benefit of priority from Japanese Patent Application No. 2021-048607, filed Mar. 23, 2021, the entire contents of which are incorporated herein by reference.

FIELD

Embodiments described herein relate generally to a storage device and a method performed by the storage device.

BACKGROUND

A storage device in which memory cells, each including a resistance change memory element, can be integrated on a semiconductor substrate has been proposed.

DETAILED DESCRIPTION

In general, according to one embodiment, a storage device includes a resistance change memory element including a first electrode, a second electrode, a resistance change layer between the first and second electrodes, including at least two elements selected from a group consisting of germanium (Ge), antimony (Sb), and tellurium (Te), and having a crystal structure with a c-axis oriented in a first direction from the first electrode toward the second electrode, and a first layer between the first electrode and the resistance change layer and including nitrogen (N) and at least one of silicon (Si) or germanium (Ge).

Hereinafter, certain example embodiments will be described with reference to the drawings.

Figure 1:
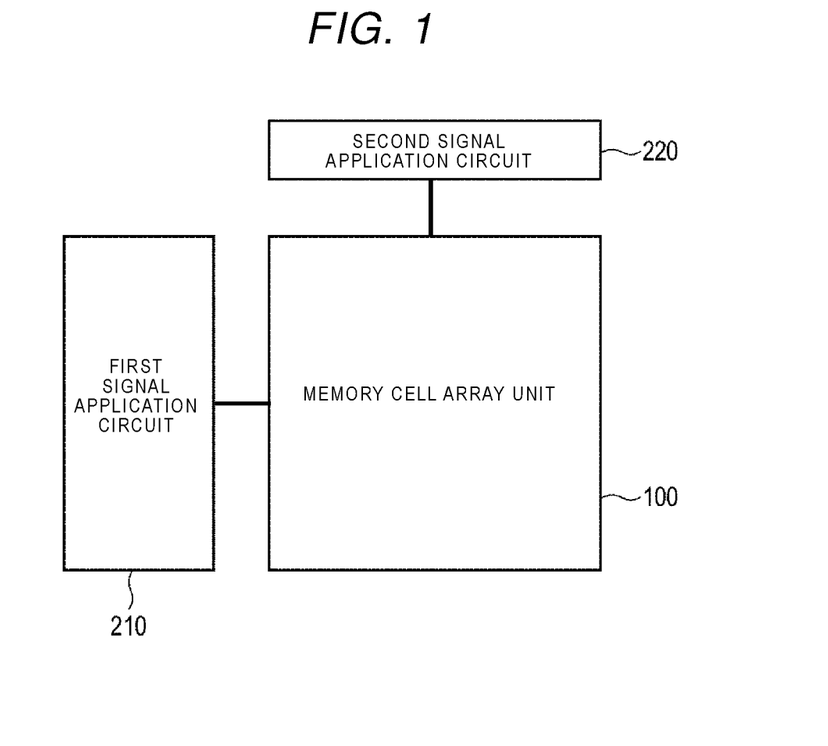
FIG. 1 is a block diagram of a storage device according to an embodiment.

FIG. 1 is a block diagram of a storage device according to an embodiment, e.g., a resistance change type nonvolatile storage device or memory.

The storage device in an embodiment includes a memory cell array unit 100, a first signal application circuit 210, and a second signal application circuit 220.

Figure 2:
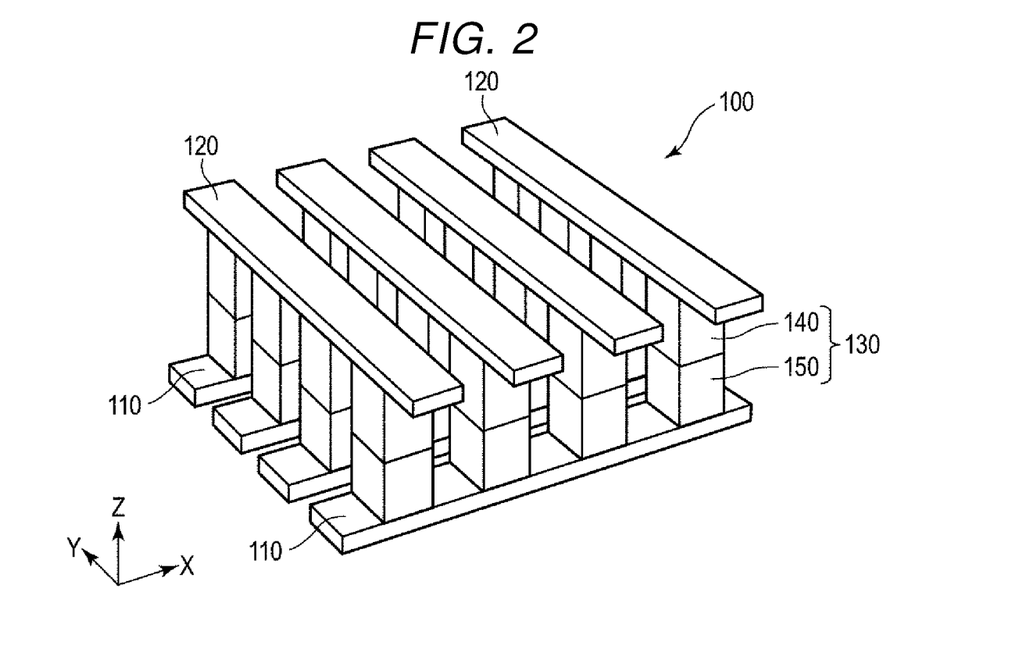
FIG. 2 is a perspective view of a memory cell array unit of a storage device according to an embodiment.

FIG. 2 is a perspective view of the memory cell array unit 100.

The memory cell array unit 100 includes: a plurality of first wirings 110 provided in a lower region including semiconductor substrate and extending along a X direction; a plurality of second wirings 120 extending along a Y direction intersecting the X direction; and a plurality of memory cells 130 connected between the first wirings 110 and the second wirings 120. One of the first wirings 110 and the second wirings 120 corresponds to word lines, and the other of the first wirings 110 and the second wirings 120 corresponds to bit lines.

The first wirings 110 are connected to the first signal application circuit 210 and the second wirings 120 are connected to the second signal application circuit 220. The first wirings 110 and the second wirings 120 and supply predetermined signals to the memory cells 130 when writing data to or reading data from a memory cell 130. In FIG. 2, the first wirings 110 is located on a lower side and the second wirings 120 are located on an upper side. In other examples, first wirings 110 may be located on the upper side and the second wirings 120 may be located on the lower side.

Each memory cell 130 includes a nonvolatile resistance change memory element 140 and a selector element 150 (also referred to as a switching element 150) connected in series to the resistance change memory element 140. In FIG. 2, the resistance change memory element 140 is located on the upper side and the selector element 150 is located on the lower side, in other examples the resistance change memory element 140 may be located on the lower side and the selector element 150 may be located on the upper side.

Figure 3:
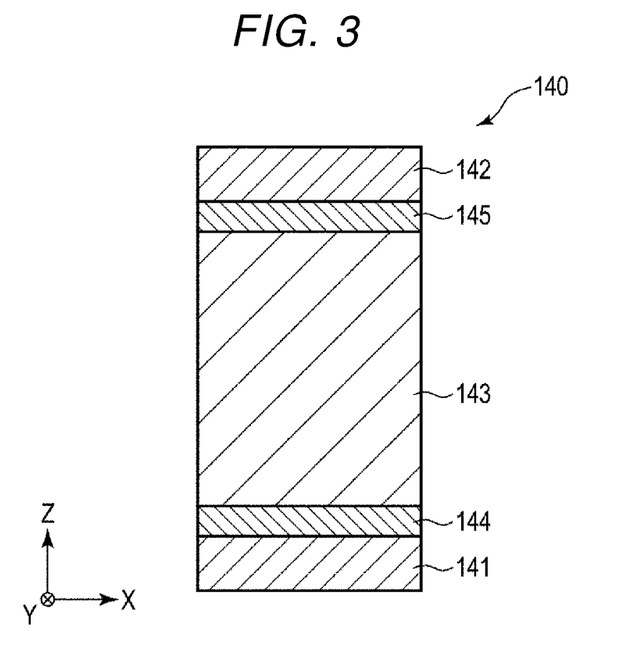
FIG. 3 is a cross-sectional view of a resistance change memory element of a storage device according to an embodiment.

FIG. 3 is a cross-sectional view of the resistance change memory element 140.

The resistance change memory element 140 includes a first electrode 141, a second electrode 142, a resistance change layer 143 provided between the first electrode 141 and the second electrode 142, a first layer 144 provided between the first electrode 141 and the resistance change layer 143 so as to be in contact with the first electrode 141 and the resistance change layer 143, and a second layer 145 provided between the second electrode 142 and the resistance change layer 143 so as to be in contact with the second electrode 142 and the resistance change layer 143. That is, the resistance change memory element 140 has a structure in which the first electrode 141, the first layer 144, the resistance change layer 143, the second layer 145, and the second electrode 142 are stacked along the Z direction in this order.

The first electrode 141 and the second electrode 142 are formed of a conductive material including a metal material or the like. The conductive material used for the first electrode 141 and the conductive material used for the second electrode 142 may be the same or different.

The resistance change layer 143 includes at least two elements selected from germanium (Ge), antimony (Sb), and tellurium (Te). In addition, the resistance change layer 143 comprises a crystalline material having a crystal plane orientation such that the c-axis is oriented in a first direction from the first electrode 141 toward the second electrode 142 (e.g., the Z direction). That is, the resistance change layer 143 has a layered material structure in which a crystalline material has its c-axis is oriented in the first direction.

Figure 4:
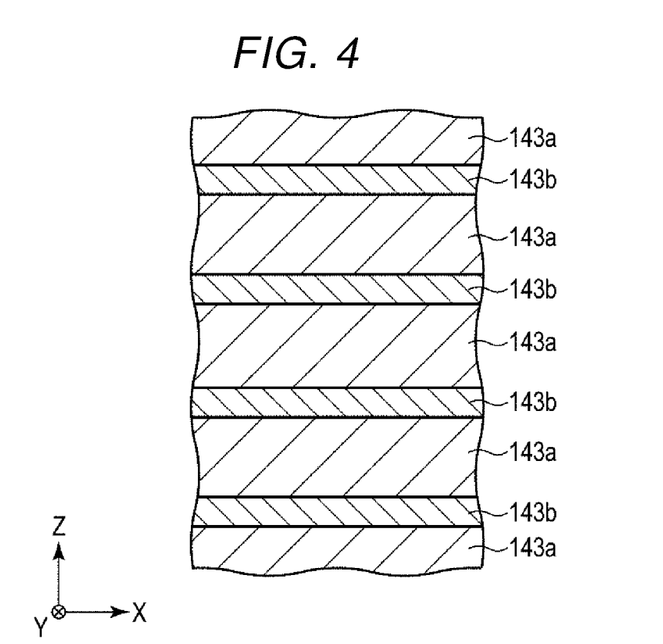
FIG. 4 is a cross-sectional view of a resistance change layer of a storage device according to an embodiment.

Specifically, the resistance change layer 143 includes at least one layer selected from an $Sb_2Te_3$ layer, a GeTe layer, and a GeSb layer. For example, the resistance change layer 143 may be formed of the $Sb_2Te_3$ layer, the GeTe layer, or the GeSb layer. As schematically shown in FIG. 4, the resistance change layer 143 may have a structure in which $Sb_2Te_3$ layers 143*a* and GeTe layers 143*b* are alternately stacked along the first direction (Z direction).

Figure 5:
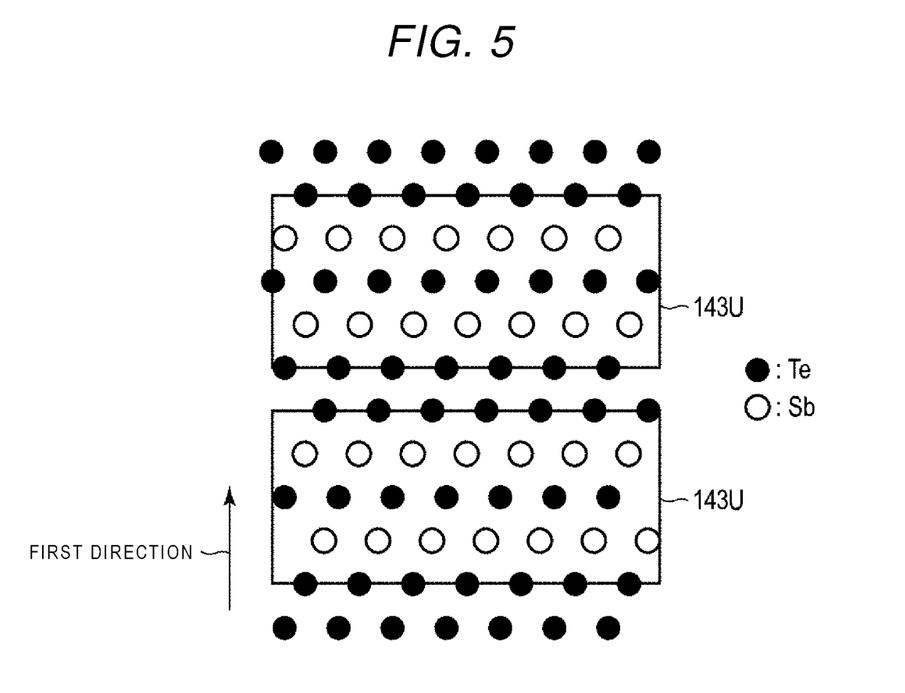
FIG. 5 is a schematic diagram of a crystal structure of a resistance change layer of a storage device according to an embodiment.

FIG. 5 is a diagram schematically illustrating a crystal structure orientation of the resistance change layer 143 in a case where the resistance change layer 143 is formed of $Sb_2Te_3$ layers. The $Sb_2Te_3$ layer has a structure in which a plurality of layered unit structures 143U each formed by two atomic layers of Sb atoms and three atomic layers of Te atoms are stacked, and a direction perpendicular to a layer plane direction of the layered unit structure 143U is the first direction, that is, the c-axis direction.

In the resistance change memory element 140, the internal structure of the resistance change layer 143 changes (for example, an atomic arrangement changes) due to a heat generation in the resistance change layer 143 due to a write signal, and the resistance change memory element 140 can exhibit a low resistance state and a high resistance state having a higher resistance value than the low resistance state according to the write signal applied thereto. Therefore, binary data can be stored in the resistance change memory element 140 in accordance with these resistance states.

The first layer 144 and the second layer 145 both include nitrogen (N) and at least one of silicon (Si) and germanium (Ge). That is, chemical formulas of the first layer 144 and the second layer 145 are expressed as: $(Si_{1-x}Ge_x)_{1-y}N_y$ ($0 \leq x \leq 1$, $0 < y < 1$).

A value of x and a value of y may be the same or different for the first layer 144 and the second layer 145.

Figure 6:
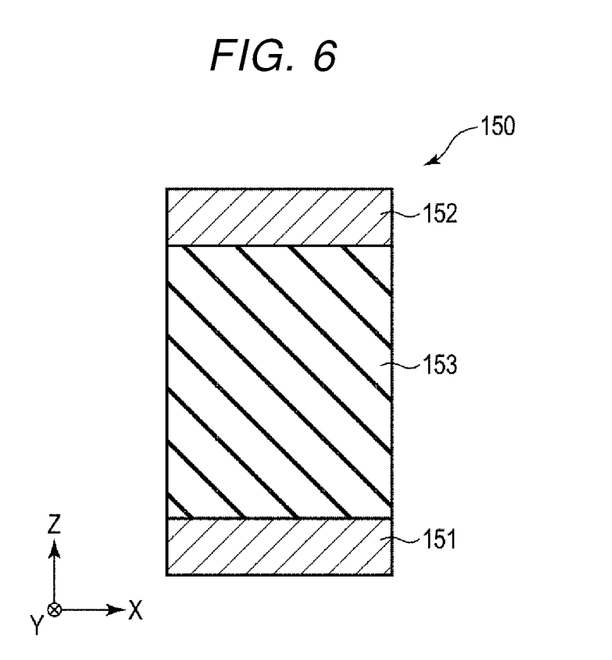
FIG. 6 is a cross-sectional view of a selector element of a storage device according to an embodiment.

FIG. 6 is a cross-sectional view schematically illustrating the selector element 150.

The selector element 150 includes a lower electrode 151, an upper electrode 152, and a selector material layer 153 located between the lower electrode 151 and the upper electrode 152. The selector element 150 is a two-terminal switching element and has a nonlinear current-voltage characteristic. When a voltage applied between the two terminals is less than a threshold value, the selector element 150 is in a high resistance state (OFF state), and when the voltage applied between the two terminals is equal to or more than the threshold value, the selector element 150 is in a low resistance state (ON state).

When a voltage equal to or higher than the predetermined voltage is applied across the first wiring 110 and the second wiring 120, the selector element 150 is in the ON state, and writing or reading can be performed on the resistance change memory element 140 connected in series to the selector element 150 in the ON state.

An electrode on a selector element 150 side of the resistance change memory element 140 and an electrode on a resistance change memory element 140 side of the selector element 150 may be integrated with each other. For example, in FIGS. 2, 3, and 6, the first electrode 141 of the resistance change memory element 140 and the upper electrode 152 of the selector element 150 may be integrated with one another.

Furthermore, in some examples, the first wiring 110 and the second wiring 120 may be used as the electrodes of the resistance change memory element 140 or the electrodes of the selector element 150. For example, in FIGS. 2, 3, and 6, the first wiring 110 may be used as the lower electrode 151 of the selector element 150, and the second wiring 120 may be used as the second electrode 142 of the resistance change memory element 140.

As described above, in the resistance change memory element 140, the first layer 144 including nitrogen (N) and at least one of silicon (Si) and germanium (Ge) is provided between the first electrode 141 and the resistance change layer 143, and the second layer 145 including nitrogen (N) and at least one of silicon (Si) and germanium (Ge) is provided between the second electrode 142 and the resistance change layer 143. As described above, a resistance change memory element 140 having excellent performance can be obtained due to the inclusion of first layer 144 and the second layer 145.

Specifically, a c-axis orientation of the crystalline material used as the resistance change layer 143 can be improved by the first layer 144 and the second layer 145. In addition, adhesion between the first electrode 141 and the resistance change layer 143 and adhesion between the second electrode 142 and the resistance change layer 143 can be improved by the presence of the first layer 144 and the second layer 145.

The resistance change layer 143 generates heat during a write operation. Thermal diffusion from the resistance change layer 143 to the first electrode 141 and the second electrode 142 can be reduced by inclusion of the first layer 144 and the second layer 145. Therefore, heat can be more effectively confined to the resistance change layer 143.

In the write operation, the first layer 144 and the second layer 145 also generate heat. Thereby, it is possible to reduce a variation in a write current or a write voltage required during the write operation.

In addition, during the write operation, crystallization of the resistance change layer 143 starts from the first layer 144 and the second layer 145, and a write speed can be improved.

An initialization operation of the resistance change memory element 140 can also be improved by the first layer 144 and the second layer 145.

Figure 7:
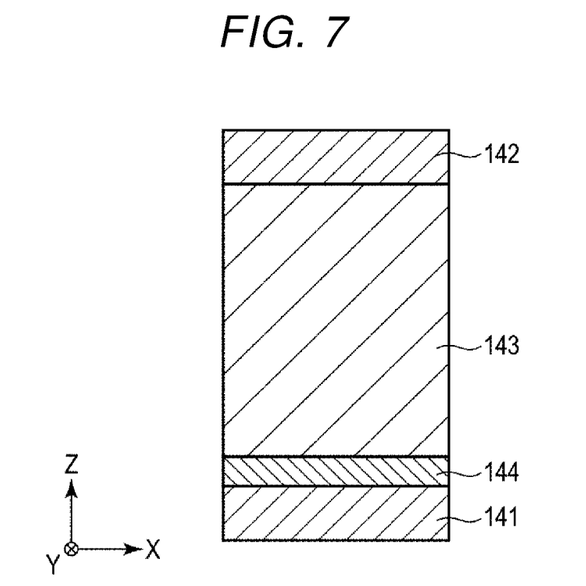
FIG. 7 is a cross-sectional view of a resistance change memory element of a storage device according to a first modification.

Both the first layer 144 and the second layer 145 are provided in the example of FIG. 3. In contrast, in other examples, only one of the first layer 144 and the second layer 145 might be provided, as schematically shown FIG. 7.

Figure 8:
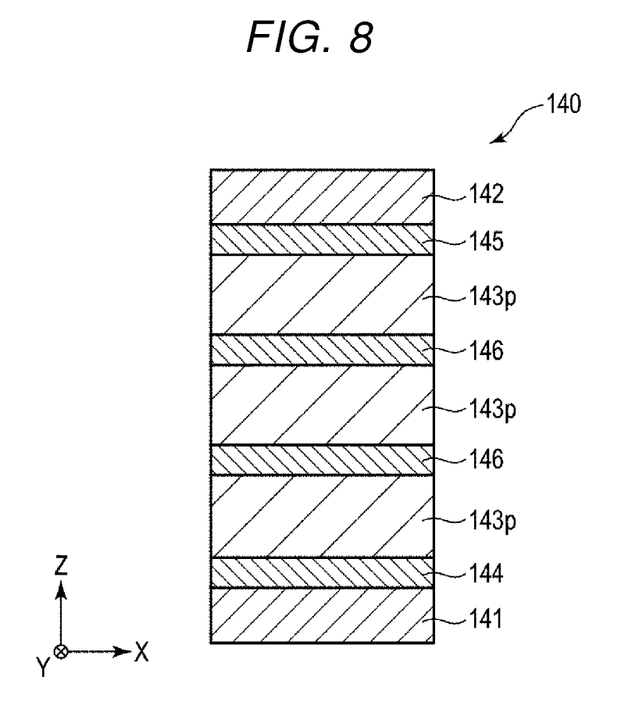
FIG. 8 is a cross-sectional view of a resistance change memory element of a storage device according to a second modification.

As shown in FIG. 8, in addition to the first layer 144 and the second layer 145, a layer 146 made of the same material as that of the layers 144 and 145 may also be provided within the resistance change layer 143. That is, one or more layers 146 may be provided between adjacent resistance change layer portions 143p in contact with these layers.

Figure 9:
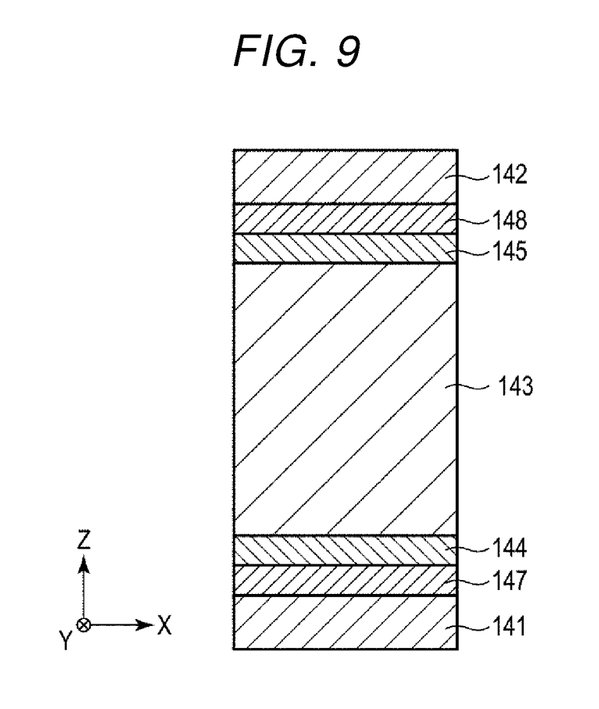
FIG. 9 is a cross-sectional view of a resistance change memory element of a storage device according to a third modification.

As shown in FIG. 9, a third layer 147 may be provided between the first electrode 141 and the first layer 144, and a fourth layer 148 may be provided between the second electrode 142 and the second layer 145.

The third layer 147 and the fourth layer 148 may include an oxide, such as silicon oxide ($SiO_2$), titanium oxide ($TiO_2$), tantalum oxide ($Ta_2O_5$), zirconium oxide ($ZrO_2$), scandium oxide ($Sc_2O_3$), aluminum oxide ($Al_2O_3$), hafnium oxide ($HfO_2$), yttrium oxide ($Y_2O_3$), and lanthanum oxide ($La_2O_3$), or a nitride, such as aluminum nitride (AlN), tantalum nitride (TaN), tantalum silicon nitride (TaSiN), titanium oxynitride (TiON), titanium aluminum nitride (TiAlN), carbon nitride (CN), and zirconium nitride (ZrN).

Figure 10:
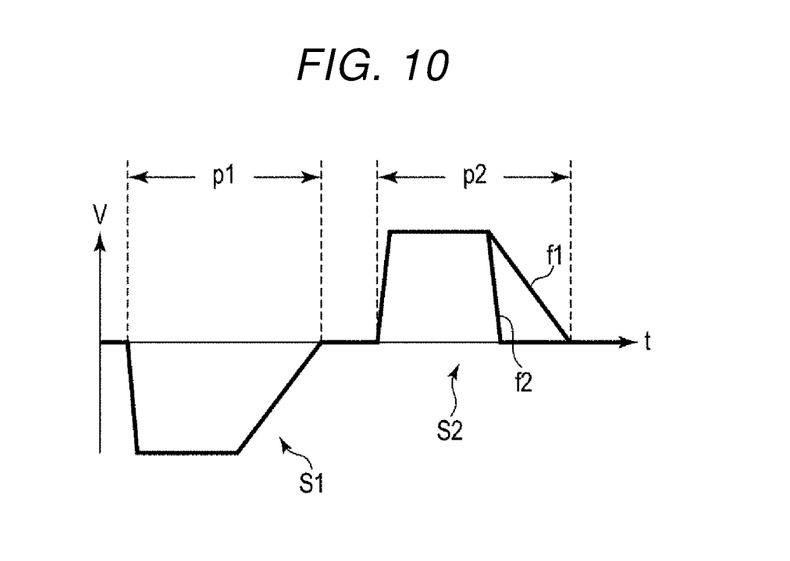
FIG. 10 is a timing diagram illustrating an initialization method and a writing method performed by a storage device according to an embodiment.

FIG. 10 is a timing diagram illustrating an initialization method and a writing method performed by the storage device according to an embodiment. A horizontal axis represents a time t, and a vertical axis represents a voltage V.

Specifically, FIG. 10 illustrates an initialization signal and a write signal applied to the resistance change memory element 140 during an initialization period p1 and a write period p2, respectively. More specifically, FIG. 10 illustrates voltage signals applied from the first signal application circuit 210 and the second signal application circuit 220 shown in FIG. 1 to the resistance change memory elements 140 in the memory cell 130 via the first wirings 110 and the second wirings 120 shown in FIG. 2.

As shown in FIG. 10, before writing is performed on the resistance change memory element 140, an initialization signal S1 having a polarity opposite to the polarity of a write signal S2 to the resistance change memory element 140 is applied to the resistance change memory element 140.

In the resistance change memory element 140, the low resistance state (referred to as the "set state") or the high resistance state (referred to as the "reset state") is set in accordance with the falling portion of the waveform) of the write signal S2. In the example shown in FIG. 10, when the falling rate is slow (or the falling time is long) (see waveform portion f1), the low resistance state is set in the resistance change memory element 140, and when the falling rate is high (or the falling time is short) (see waveform portion f2), the high resistance state is set in the resistance change memory element 140.

The initialization signal S1 has a polarity opposite to that of a low resistance state setting signal when the resistance change memory element 140 is set to the low resistance state, and preferably has a shape corresponding to the shape of the low resistance state setting signal (specifically, the same but mirrored shape).

Figure 11:
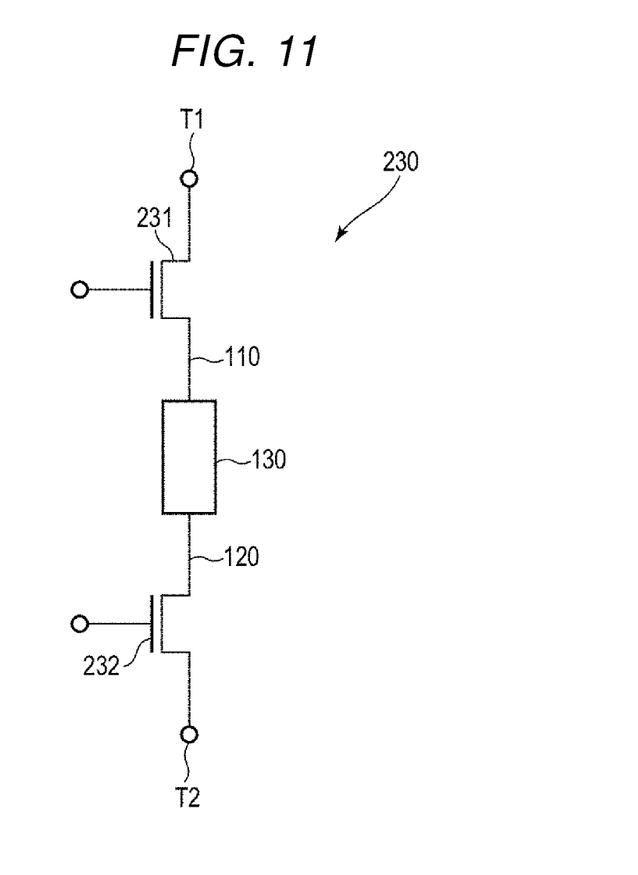
FIG. 11 is a circuit diagram of a signal generation circuit included in a signal application circuit of a storage device according to an embodiment.

FIG. 11 is a circuit diagram of the signal generating circuit 230 included in the first signal application circuit 210 and the second signal application circuit 220.

Figure 12A:
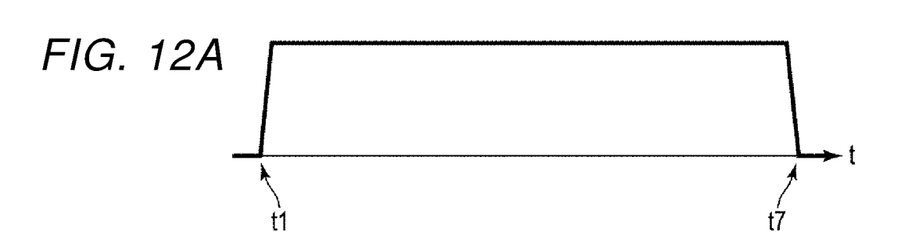
FIG. 12A to FIG. 12D show timing diagrams illustrating operations of a signal generation circuit of a storage device according to an embodiment.
Figure 12B:
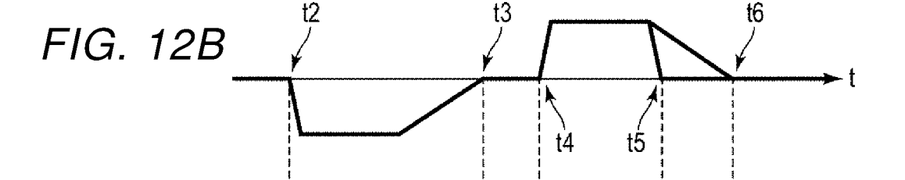
Figure 12C:
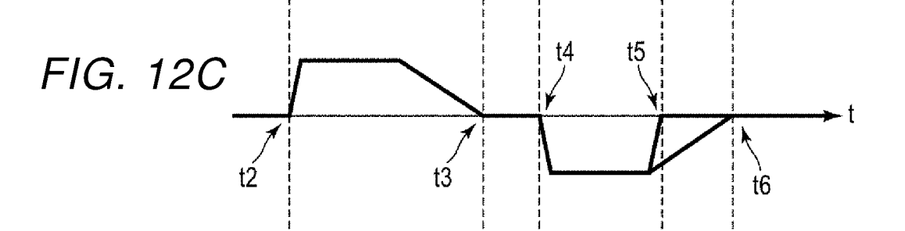

FIGS. 12A to 12D show timing diagrams illustrating operations of the signal generating circuit 230 shown in FIG. 11. FIG. 12A shows a voltage applied to gates of transistors 231 and 232, FIG. 12B shows a voltage applied from a terminal T1, and FIG. 12C shows a voltage applied from a terminal T2.

Figure 12D:
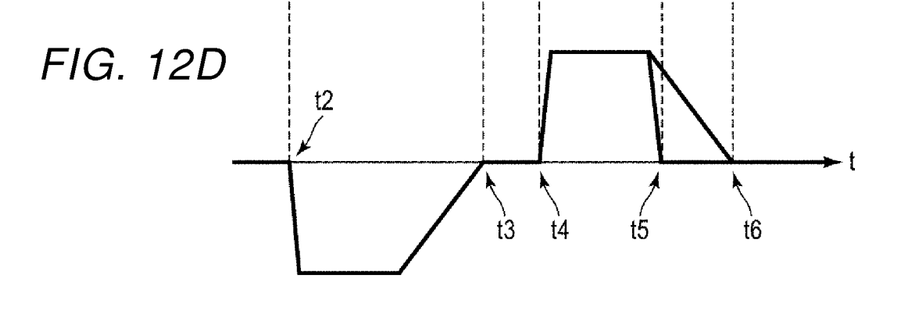

First, at a time point t1, an ON voltage is applied to the gates of the transistors 231 and 232, and the transistors 231 and 232 are in the ON state. Subsequently, at a time point t2, application of a negative voltage to the terminal T1 is started, and application of a positive voltage to the terminal T2 is started. Therefore, from the time point t2 to a time point t3, a negative polarity initialization signal as shown in FIG. 12D is applied to the resistance change memory element in the memory cell 130, and a current flows from the terminal T2 to the terminal T1.

After the initialization operation is completed as described above, at a time point t4, application of the positive voltage to the terminal T1 is started, and application of the negative voltage to the terminal T2 is started. Therefore, from the time point t4 to a time point t5 in a case of writing to the high resistance state (reset state), and from the time point t4 to a time point t6 in a case of writing to the low resistance state (set state), a positive polarity write signal as shown in FIG. 12D is applied to the resistance change memory element in the memory cell 130, and the current flows from the terminal T1 to the terminal T2.

After the write operation is completed as described above, at a time point t7, an OFF voltage is applied to the gates of the transistors 231 and 232, and the transistors 231 and 232 are shifted to the OFF state.

As described above, before the writing is performed on the resistance change memory element 140, the initialization signal S1 having the polarity opposite to that of the write signal S2 is applied to the resistance change memory element 140. By applying such an initialization signal to the resistance change memory element 140, the following effects can be obtained.

Generally, before an initialization operation is performed, the electrical resistance at an interface between a resistance changing layer and an electrode is high, and thus a resistance ratio of a resistance in a low resistance state to a resistance in a high resistance state cannot be increased. When an initialization signal is applied to the resistance change memory element, elements contained in the resistance change layer such as Ge and Sb move to an electrode side, and ultrathin layers in which a composition is shifted (hereinafter referred to as "stable layers") are generated between the resistance change layer and the electrode. The stable layers reduce the electrical resistance at the interface between the resistance change layer and the electrode.

However, if the initialization operation is performed using only an initialization signal having a polarity the same as a polarity of a write signal, a stable layer is formed on one interface between the resistance change layer and the electrode, but no stable layer is formed on the other interface. Therefore, although the electrical resistance is reduced at the one interface, high electrical resistance is maintained at the other interface, and a resistance of the entire resistance change memory element greatly depends on the interface resistance. Therefore, it is difficult to increase the resistance ratio of the resistance in the low resistance state to the resistance in the high resistance state.

In the above embodiments, since an initialization signal having the polarity opposite to the polarity of the write signal is applied to the resistance change memory element, a stable layer is formed on the one interface between the resistance change layer and the electrode by the initialization signal, and a stable layer is also formed on the other interface by the write signal. In addition, due to a heat generation effect of an interface layer, a movement of the elements such as Ge and Sb contained in the resistance change layer toward both electrodes is promoted. Furthermore, atoms diffuse between the resistance change layer and two interface layers, and the stable layers can be more effectively formed.

For the above reasons, the electrical resistances at the interfaces between the resistance change layer and both electrodes are reduced, and the resistance ratio of the resistance in the low resistance state to the resistance in the high resistance state can be increased. As a result, the initialization operation can be simplified, and the initialization time can be significantly reduced.

Various initialization signals as described below can be used for the initialization operation.

Figure 13:
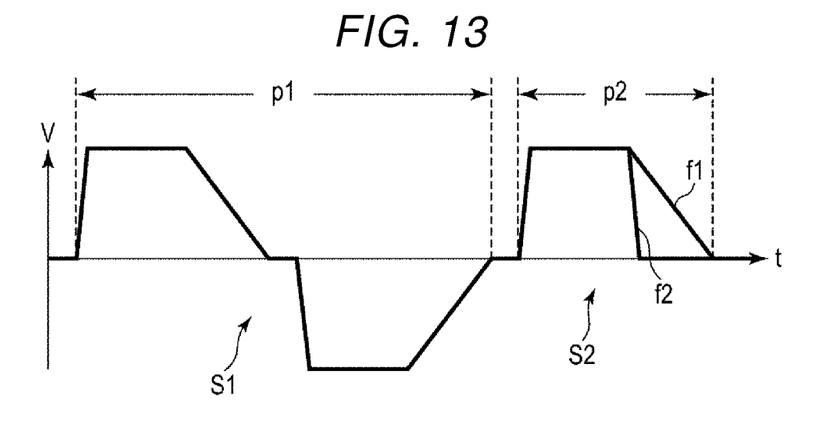
FIG. 13 is a timing diagram illustrating an initialization method and a writing method performed by a storage device according to a first modification.

FIG. 13 is a timing diagram of the initialization signal according to a first modification.

In the first modification, in the initialization period p1, a signal having a polarity the same as that of the write signal S2 (positive polarity) and a signal having a polarity opposite to that of the write signal (negative polarity) are applied to the resistance change memory element 140 as the initialization signal S1, and in the subsequent write period p2, the write signal S2 is applied to the resistance change memory element 140.

In the first modification, by applying a signal having positive polarity and a signal having negative polarity to the resistance change memory element 140 as the initialization signal S1 during the initialization period p1, stable layers can be formed at the interfaces between the resistance change layer and both the electrodes in the initialization period p1. Thereby, the resistance ratio of the resistance in the low resistance state to the resistance in the high resistance state of the resistance change memory element 140 can be more reliably increased.

Figure 14:
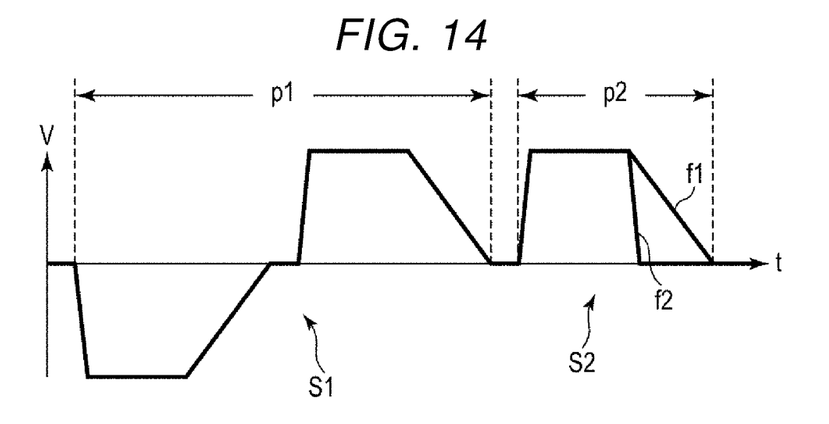
FIG. 14 is a timing diagram illustrating an initialization method and a writing method of a storage device according to a second modification.

FIG. 14 is a timing diagram of the initialization signal according to a second modification.

In the first modification described above, in the initialization period p1, after a signal having the polarity the same as that of the write signal S2 (positive polarity) is applied, a signal having the polarity opposite to that of the write signal (negative polarity) is applied to the resistance change memory element 140. However, in the second modification, in the initialization period p1, after a signal having the polarity opposite to that of the write signal S2 (negative polarity) is applied, a signal having the polarity the same as that of the write signal (positive polarity) is applied to the resistance change memory element 140.

Also in the second modification, similarly to the first modification, stable layers can be formed at the interfaces between the resistance change layer and both electrodes in the initialization period p1, and the resistance ratio of the resistance in the low resistance state to the resistance in the high resistance state of the resistance change memory element 140 can be more reliably increased.

Figure 15A:
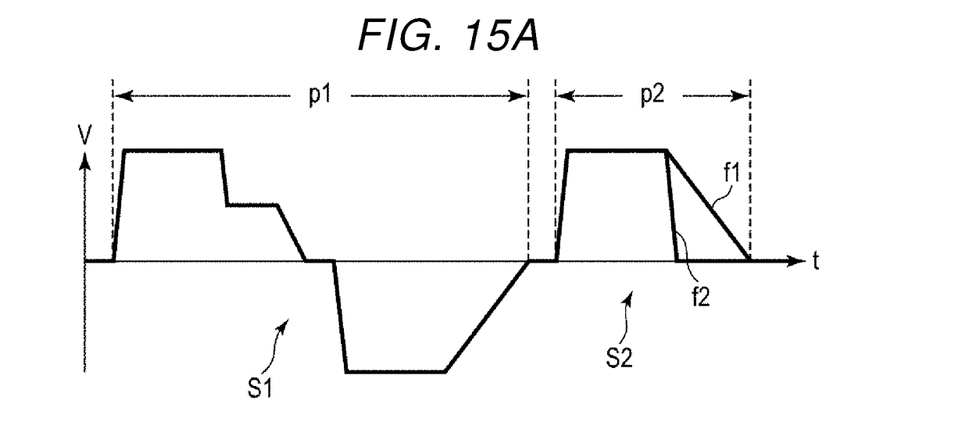
FIG. 15A is a timing diagram illustrating an initialization method and a writing method performed by a storage device according to a third modification.
Figure 15B:
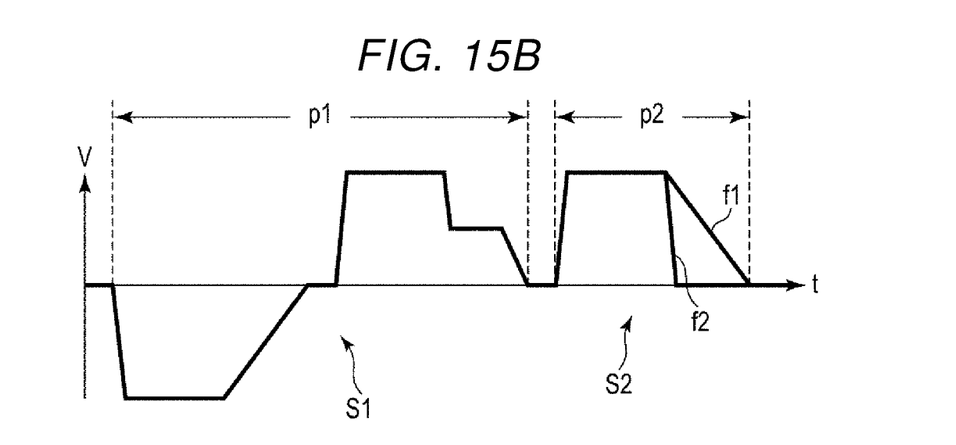
FIG. 15B is a timing diagram illustrating an initialization method and a writing method performed by a storage device according to a fourth modification.

FIGS. 15A and 15B are timing diagrams of the initialization signals according to third and fourth modifications, respectively.

In the third and fourth modifications, signals that fall in two stages (steps) are used for the initialization signal S1. When such an initialization signal S1 is used, the same effects as those described above with respect to the first and second modifications can be obtained as well.

Figure 16A:
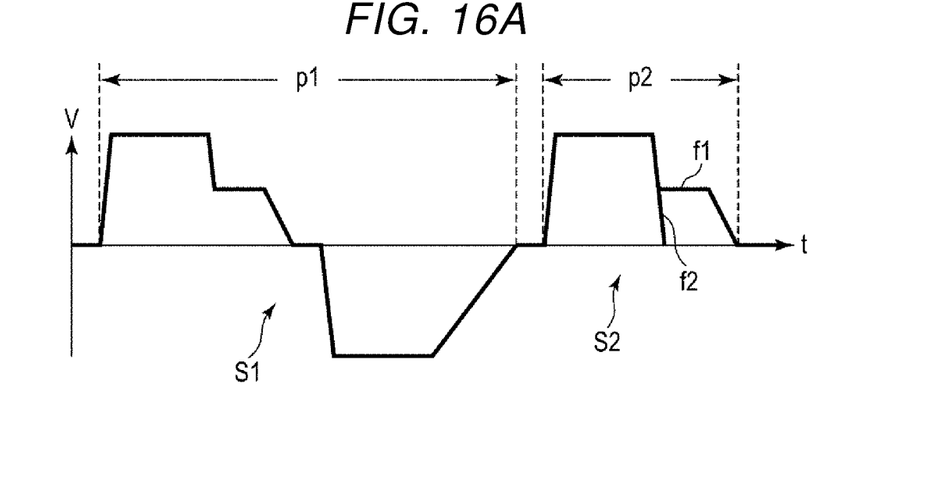
FIG. 16A is a timing diagram illustrating an initialization method and a writing method performed by a storage device according to a fifth modification.
Figure 16B:
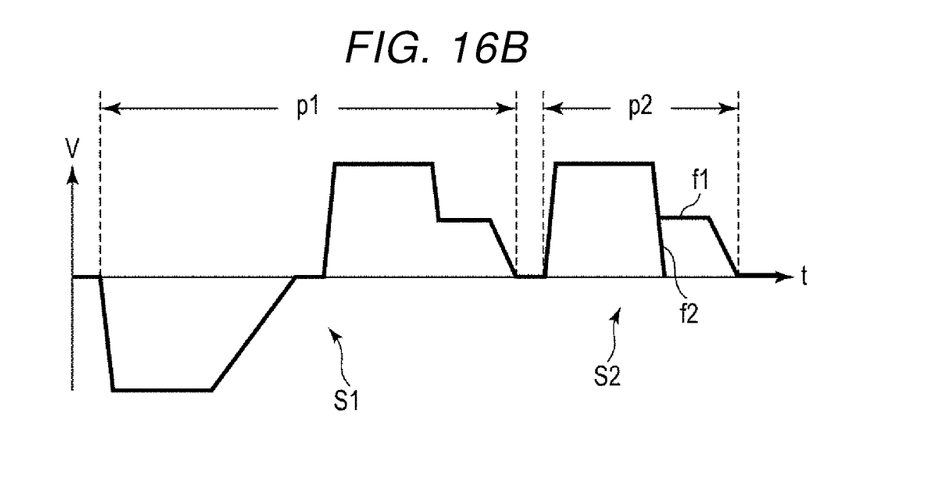
FIG. 16B is a timing diagram illustrating an initialization method and a writing method performed by a storage device according to a sixth modification.

FIGS. 16A and 16B are timing diagrams of the initialization signals according to fifth and sixth modifications, respectively.

In the fifth and sixth modifications, a signal f1 that falls in the two stages is also used for the write signal S2 for setting the low resistance state. When such a write signal S2 is used, the same effects as those described above can be obtained as well.

Figure 17:
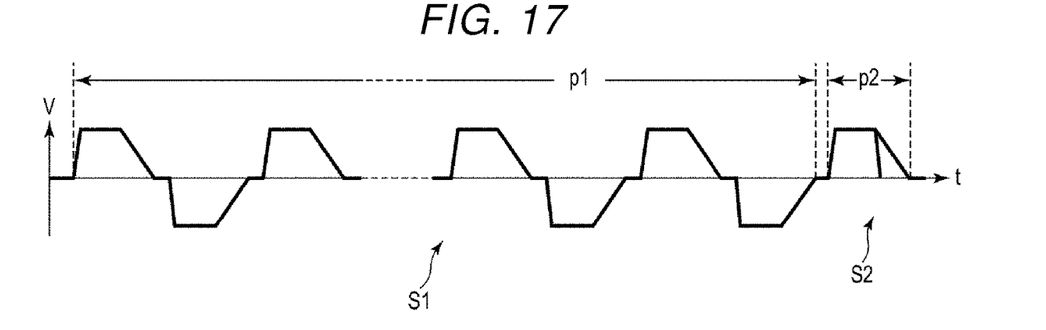
FIG. 17 is a timing diagram illustrating an initialization method and a writing method performed by a storage device according to a seventh modification.

FIG. 17 is a timing diagram of the initialization signal according to a seventh modification.

In the seventh modification, in the initialization period p1, as the initialization signal S1, a signal having the polarity the same as the polarity of the write signal (positive polarity) and a signal having the polarity opposite to the polarity of the write signal (negative polarity) are alternately applied to the resistance change memory element 140.

In the seventh modification, by alternately applying a signal having the positive polarity and a signal having the negative polarity to the resistance change memory element 140 during the initialization period p1, stable layers can be more reliably formed at the interfaces between the resistance change layer and both electrodes in the initialization period p1. Thereby, the resistance ratio between the resistance in the low resistance state and the resistance in the high resistance state of the resistance change memory element 140 can be further reliably increased.

Figure 18:
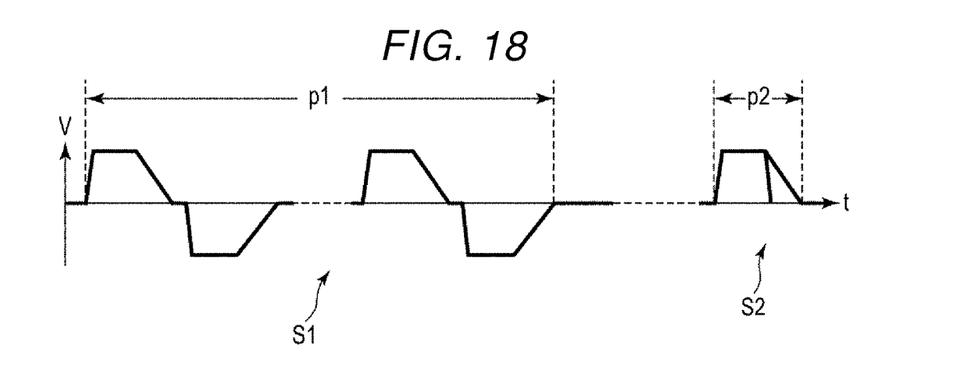
FIG. 18 is a timing diagram illustrating an initialization method and a writing method performed by the storage device according to an eighth modification.

FIG. 18 is a timing diagram of the initialization signal according to an eighth modification.

In the above embodiments and modifications, the initialization period p1 is immediately before the write period p2 with little to no time gap between the different periods, and thus the initialization signal S1 is applied to the resistance change memory element 140 immediately before the write signal S2 is applied to the resistance change memory element 140 with little to no time gap between the application of these signals. In the eighth modification, the initialization period p1 is well before the write period p2 (a substantial time gap is left between the initialization period p1 and the write period p2). The timing for applying the initialization signal S1 is not particularly limited as long is the initialization occurs at some point before the write signal S2 is applied.

For example, the initialization period p1 may be provided periodically at regular intervals or the like, and the initialization signal S1 may be applied to the resistance change memory element 140 at regular intervals. Furthermore, the initialization signal S1 need not be applied immediately before every writing signal S2, but, for example, a predetermined number of consecutive writings may occur after an initialization before the next initialization is performed.

In the eighth modification, since the initialization operation does not need to be performed immediately before the write operation, it is possible to more quickly perform writings when a write request is issued. In addition, since a separate initialization operation does not need to be performed for each write operation, the total number of initialization operations can be reduced.

Figure 19:
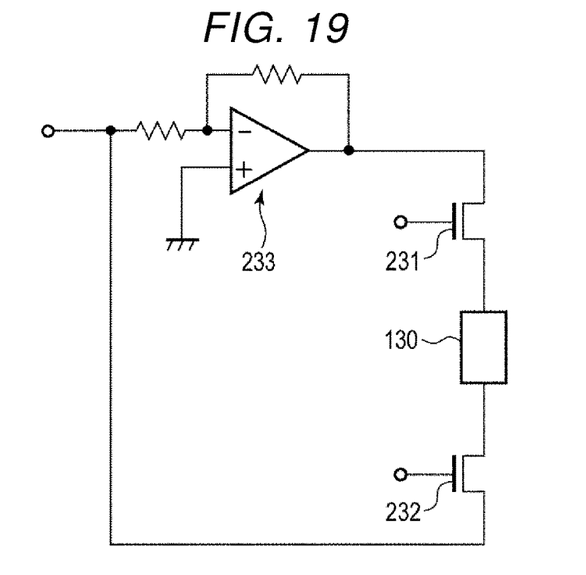
FIG. 19 is a circuit diagram of a signal generation circuit included in a signal application circuit of a storage device according to a modification.

FIG. 19 is a circuit diagram of the signal generation circuit 230 according to a modification.

In the present modification, the initialization signal is generated using an inverting amplifier circuit 233. That is, by providing a delay between an input signal and an output signal of an operational amplifier by a delay component in a circuit, it is possible to apply a signal as shown in the initialization period p1 of FIG. 17, for example, to the memory cell.

In the initialization method and the writing method of the storage devices described above, the resistance change layer 143 of the resistance change memory element 140 need not have the c-axis oriented in the first direction (the Z direction).

In the initialization method and the writing method of the storage devices described above, the first layer 144 and the second layer 145 of the resistance change memory element 140 need not contain nitrogen (N) as long as at least one of silicon (Si) and germanium (Ge) is in the resistance change memory element 140.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A storage device, comprising:
a resistance change memory element including:
a first electrode,
a second electrode,
a resistance change layer between the first and second electrodes, including at least two elements selected from a group consisting of germanium (Ge), antimony (Sb), and tellurium (Te), and having a crystal structure with a c-axis oriented in a first direction from the first electrode toward the second electrode, and
a first layer between the first electrode and the resistance change layer and including nitrogen (N) and at least one of silicon (Si) or germanium (Ge).

2. The storage device according to claim 1, wherein the resistance change memory element further includes a second layer between the second electrode and the resistance change layer and including nitrogen (N) and at least one of silicon (Si) or germanium (Ge).

3. The storage device according to claim 1, wherein the resistance change layer includes at least one selected from an $Sb_2Te_3$ layer, a GeTe layer, and a GeSb layer.

4. The storage device according to claim 1, wherein the resistance change layer includes a plurality of $Sb_2Te_3$ layers and GeTe layers that are alternately stacked along the first direction.

5. The storage device according to claim 1, wherein the resistance change memory element further includes a third layer between the first electrode and the first layer and including an oxide or a nitride.

6. The storage device according to claim 5, wherein the resistance change memory element further includes:
a second layer between the second electrode and the resistance change layer and including nitrogen (N) and at least one of silicon (Si) or germanium (Ge), and
a fourth layer between the second electrode and the second layer and including an oxide or a nitride.

7. The storage device according to claim 1, wherein the resistance change memory element switches between a first resistance state and a second resistance state having a higher resistance value than the first resistance state.

8. The storage device according to claim 1, further comprising:
a selector element connected in series to the resistance change memory element.

9. A storage device, comprising:
a resistance change memory element including:
a first electrode,
a second electrode,
a resistance change layer between the first and second electrodes and including at least two elements selected from a group consisting of germanium (Ge), antimony (Sb), and tellurium (Te), and
a first layer between the first electrode and the resistance change layer and including at least one of silicon (Si) or germanium (Ge); and
a signal application circuit configured to apply a first voltage having a first polarity opposite to a second polarity of a write voltage to the resistance change memory element before applying the write voltage to the resistance change memory element,
wherein the first layer further contains nitrogen (N).

10. The storage device according to claim 9, wherein the resistance change layer includes a material having a crystal structure, a c-axis of which is oriented in a first direction from the first electrode toward the second electrode.

11. The storage device according to claim 9, wherein the resistance change memory element further includes a second layer between the second electrode and the resistance change layer and including at least one of silicon (Si) or germanium (Ge).

12. The storage device according to claim 9, wherein the signal application circuit is further configured to, before applying the write voltage, further apply a second voltage having the second polarity to the resistance change memory element.

13. The storage device according to claim 9, wherein the signal application circuit is further configured to, before applying the write voltage, alternately apply voltages having the first polarity and voltages having the second polarity to the resistance change memory element.

14. The storage device according to claim 9, wherein the resistance change memory element switches between a first resistance state and a second resistance state having a higher resistance value than the first resistance state in accordance with the write voltage.

15. The storage device according to claim 14, wherein the resistance change memory element is switched to the first resistance state when the write voltage is applied.

16. The storage device according to claim 15, wherein a waveform of the first voltage has a shape corresponding to a shape of a waveform of the write voltage.

17. The storage device according to claim 9, further comprising:
a selector element connected in series to the resistance change memory element.

18. The storage device according to claim 9, wherein the signal application circuit is configured to, before applying the write voltage, apply a third voltage lower than the first voltage and having the first polarity to the resistance change memory element.

19. A data writing method performed by a storage device that comprises a resistance change memory element including a first electrode, a second electrode, a resistance change layer between the first and second electrodes and including at least two elements selected from a group consisting of germanium (Ge), antimony (Sb), and tellurium (Te), and a first layer between the first electrode and the resistance change layer and including at least one of silicon (Si) or germanium (Ge), the method comprising:
- applying a first voltage having a first polarity to the resistance change memory element; and
- after applying the first voltage, applying a write voltage having a second polarity opposite to the first polarity to the resistance change memory element, wherein the first layer further contains nitrogen (N).

20. A storage device, comprising:
- a resistance change memory element including:
  - a first electrode,
  - a second electrode,
  - a resistance change layer between the first and second electrodes and including at least two elements selected from a group consisting of germanium (Ge), antimony (Sb), and tellurium (Te), and
  - a first layer between the first electrode and the resistance change layer and including at least one of silicon (Si) or germanium (Ge); and
- a signal application circuit configured to apply a first voltage having a first polarity opposite to a second polarity of a write voltage to the resistance change memory element before applying the write voltage to the resistance change memory element, wherein the resistance change memory element further includes a second layer between the second electrode and the resistance change layer and including at least one of silicon (Si) or germanium (Ge).

21. The storage device according to claim 20, wherein the resistance change layer includes a material having a crystal structure, a c-axis of which is oriented in a first direction from the first electrode toward the second electrode.

22. The storage device according to claim 20, wherein the signal application circuit is further configured to, before applying the write voltage, further apply a second voltage having the second polarity to the resistance change memory element.

23. The storage device according to claim 20, wherein the signal application circuit is further configured to, before applying the write voltage, alternately apply voltages having the first polarity and voltages having the second polarity to the resistance change memory element.

24. The storage device according to claim 20, wherein the resistance change memory element switches between a first resistance state and a second resistance state having a higher resistance value than the first resistance state in accordance with the write voltage.

25. The storage device according to claim 24, wherein the resistance change memory element is switched to the first resistance state when the write voltage is applied.

26. The storage device according to claim 25, wherein a waveform of the first voltage has a shape corresponding to a shape of a waveform of the write voltage.

27. The storage device according to claim 20, further comprising:
- a selector element connected in series to the resistance change memory element.

28. The storage device according to claim 20, wherein the signal application circuit is configured to, before applying the write voltage, apply a third voltage lower than the first voltage and having the first polarity to the resistance change memory element.

* * * * *